United States Patent
Aronowitz et al.

(10) Patent No.: US 6,303,047 B1
(45) Date of Patent: Oct. 16, 2001

(54) LOW DIELECTRIC CONSTANT MULTIPLE CARBON-CONTAINING SILICON OXIDE DIELECTRIC MATERIAL FOR USE IN INTEGRATED CIRCUIT STRUCTURES, AND METHOD OF MAKING SAME

(75) Inventors: Sheldon Aronowitz, San Jose; Valeriy Sukharev, Cupertino; Vladimir Zubkov, Mountain View, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/274,457

(22) Filed: Mar. 22, 1999

(51) Int. Cl.[7] .............................. B05D 5/12; B32B 5/14; C09K 3/00
(52) U.S. Cl. ..................... 252/1; 106/287.13; 257/411; 427/99; 427/220; 428/404
(58) Field of Search ............... 106/287.13; 427/220, 427/99; 428/404; 148/240; 257/411, 65; 501/133; 252/1

(56) References Cited

U.S. PATENT DOCUMENTS

| | | | |
|---|---|---|---|
| 3,012,861 | * 12/1961 | Ling ................... | 428/404 X |
| 3,178,392 | * 4/1965 | Kriner ................. | 106/287.13 X |
| 3,652,331 | 3/1972 | Yamazaki ............. | 117/201 |
| 3,832,202 | * 8/1974 | Ritchie ................. | 106/287.13 |
| 3,920,865 | * 11/1975 | Läufer et al. .......... | 427/220 |
| 4,705,725 | * 11/1987 | Glajch et al. ......... | 428/404 X |
| 4,771,328 | 9/1988 | Malaviya et al. ..... | 357/49 |
| 5,194,333 | * 3/1993 | Ohnaka et al. ....... | 427/220 X |
| 5,364,800 | 11/1994 | Joyner ................. | 437/28 |
| 5,376,595 | 12/1994 | Zupancic et al. ..... | 501/12 |
| 5,470,801 | 11/1995 | Kapoor et al. ....... | 437/238 |
| 5,559,367 | 9/1996 | Cohen et al. ......... | 257/77 |
| 5,675,187 | 10/1997 | Numata eta l. ...... | 257/758 |
| 5,688,724 | 11/1997 | Yoon et al. .......... | 437/235 |
| 5,858,879 | 1/1999 | Chao et al. .......... | 438/725 |
| 5,864,172 | 1/1999 | Kapoor et al. ....... | 257/634 |
| 5,874,745 | * 2/1999 | Kuo .................... | 257/411 X |
| 5,882,489 | 3/1999 | Bersin et al. ........ | 204/192.35 |
| 5,904,154 | 5/1999 | Chien et al. ......... | 134/1.2 |
| 5,939,763 | 8/1999 | Hao et al. ............ | 257/411 |
| 6,025,263 | 2/2000 | Tsai et al. ........... | 438/624 |
| 6,037,248 | 3/2000 | Ahn .................... | 438/619 |
| 6,051,477 | 4/2000 | Nam ................... | 438/404 |
| 6,066,574 | 5/2000 | You et al. ............ | 438/781 |
| 6,232,658 | 5/2001 | Catabay et al. ...... | 257/701 |

FOREIGN PATENT DOCUMENTS 12-267128   9/2000   (JP) ............... G02F/1/136

OTHER PUBLICATIONS

McClatchie, S., et al., "Low Dielectric Constant Oxide Films Deposited Using CVD Techniques", 1998 Proceedings Fourth International DUMIC Conference, Feb. 16–17, 1998, pp. 311–318.

Peters, Laura, "Pursuing the Perfect Low-k Dielectric", *Semiconductor International*, Sep., 1998, pp. 64–66, 68, 70, 72, and 74.

Tannenbaum, Stanley, et al., "Synthesis and Properties of Some Alkylsilanes", J. Am. Chem. Soc., 75, Aug. 5, 1953, pp. 3753–3757.

Koda, Seiichiro, et al., "A Study of Inhibition Effects for Silane Combustion by Additive Gases", *Combustion and Flame*, vol. 73, No. 2, Aug., 1988, pp. 187–194.

Koda, Seiichiro, et al., "A Study of Inhibition Effects for Silane Combustion by Additive Gases", *Combustion and Dlame*, vol. 73, No. 2, Aug., 1988, pp. 187–194.

* cited by examiner

*Primary Examiner*—Richard D. Lovering
(74) *Attorney, Agent, or Firm*—John P. Taylor

(57) ABSTRACT

A low dielectric constant multiple carbon-containing silicon oxide dielectric material for an integrated circuit structure is described which comprises a silicon oxide material including silicon atoms which are each bonded to a multiple carbon-containing group consisting of carbon atoms and primary hydrogens. Preferably such multiple carbon-containing groups have the general formula $—(C)_y(CH_3)_z$, where y is an integer from 1 to 4 for a branched alkyl group and from 3 to 5 for a cyclic alkyl group, and z is $2y+1$ for a branched alkyl group and $2y-1$ for a cyclic alkyl group. In one embodiment the low dielectric constant multiple carbon-containing silicon oxide dielectric material is made by reacting with a mild oxidizing agent a multiple carbon-substituted silane having only primary hydrogens bonded to the carbon atoms and having the formula $SiH_x((C)_y(CH_3)_z)_{(4-x)}$, where x ranges from 1 to 3, y is an integer from 1 to 4 for a branched alkyl group and from 3 to 5 for a cyclic alkyl group, and z is $2y+1$ for a branched alkyl group and $2y-1$ for a cyclic alkyl group.

32 Claims, 1 Drawing Sheet

PROVIDING A MULTIPLE CARBON-SUBSTITUTED SILANE HAVING ONLY PRIMARY HYDROGENS BONDED TO THE CARBON ATOMS AND HAVING THE FORMULA $SiH_x((C)_y(CH_3)_z)_{(4-x)}$ WHERE x RANGES FROM 1 TO 3, y IS AN INTEGER FROM 1 TO 4 FOR A BRANCHED ALKYL GROUP AND FROM 3 TO 5 FOR A CYCLIC ALKYL GROUP, AND z IS 2y+1 FOR A BRANCHED ALKYL GROUP AND 2y-1 FOR A CYCLIC ALKYL GROUP

REACTING THE MULTIPLE CARBON-SUBSTITUTED SILANE HAVING ONLY PRIMARY HYDROGENS BONDED TO THE CARBON ATOMS WITH A MILD OXIDIZING AGENT

DEPOSITING ON A SUBSTRATE A LOW DIELECTRIC CONSTANT MULTIPLE CARBON-CONTAINING SILICON OXIDE DIELECTRIC MATERIAL WHICH INCLUDES CARBON ATOMS WHICH ARE EACH BONDED TO A MULTIPLE CARBON-CONTAINING GROUP CONSISTING OF CARBON ATOMS AND PRIMARY HYDROGENS AND HAVING THE GENERAL FORMULA $-(C)_y(CH_3)_z$ WHERE y IS AN INTEGER FROM 1 TO 4 FOR A BRANCHED ALKYL GROUP AND FROM 3 TO 5 FOR A CYCLIC ALKYL GROUP, AND z IS 2y+1 FOR A BRANCHED ALKYL GROUP AND 2y-1 FOR A CYCLIC ALKYL GROUP

LOW DIELECTRIC CONSTANT MULTIPLE CARBON-CONTAINING SILICON OXIDE DIELECTRIC MATERIAL FOR USE IN INTEGRATED CIRCUIT STRUCTURES, AND METHOD OF MAKING SAME

BACKGROUND OF THE INVENTION

1. Field of the Invention

This invention relates to integrated circuit structures. More particularly, this invention relates to a silicon oxide dielectric material with a low dielectric constant useful in the formation of a dielectric layer in an integrated circuit structure.

2. Description of the Related Art

The shrinking of integrated circuits has resulted in levels of interconnects, including metal interconnects, being placed closer together, as well as reduction of the horizontal spacing between metal lines on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture. The article goes on to state that beyond methyl silane, studies show a possible k of 2.75 using dimethyl silane in the Flowfill process. The Peters article further states that in high density plasma (HDP) CVD, dielectric material formed from methyl silane or dimethyl silane and $O_2$ can provide a k as low as 2.75; and that trimethyl silane, available from Dow-Corning, can be used to deposit low-k (2.6) dielectric films.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on Feb. 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9. The authors then further describe the formation of low-k dielectric material using dimethyl silane ($CH_3)_2$—$SiH_2$, thereby achieving a dielectric constant of ~2.75. However, the authors point out that the methyl silane and the dimethyl silane both result in carbon being bound into the oxide lattice via a Si—$CH_3$ bond which results in the termination of the siloxane chain. The authors further state that the addition of further $CH_3$ groups bound to the silicon atom is thought to be prohibitive because an increase in the number of $CH_3$ groups reduces the number of sites available to form the siloxane chain. Instead, the authors reported taking a different approach by incorporating the carbon as part of the siloxane chain itself so that the siloxane chain would not be broken. The authors then report on the use of methylenebis-silane ($SiH_3$—$CH_2$—$SiH_3$) instead of methyl silane as the precursor material reacted with $H_2O_2$ whereby the $SiH_3$ functional groups can take part in the polymerization reactions with $H_2O_2$ leaving the Si—$CH_2$—Si backbone intact as a part of the siloxane chain, and state that a dielectric material having a dielectric constant of ~2.7 can be achieved by using methylenebis-silane in place of methyl silane as the precursor.

Attempts have been made to lower the dielectric constant of the film by increasing the carbon content in the dielectric film using phenyl silane as the precursor. While a film having a low dielectric constant was obtained, using a phenyl silane precursor, the dielectric constant was found to vary from film to film with k values between ~2.1 to ~2.8, i.e., formation of a film with a given k value was not reproducible.

It would, therefore, be desirable to reproducibly form a carbon-containing silicon oxide dielectric material having a dielectric constant preferably as low as or lower than the dielectric constant of the carbon-containing silicon oxide dielectric material formed using methyl silane as the precursor. It would also be desirable to be able to control or tailor the dielectric constant of a carbon-containing silicon oxide dielectric material formed using a carbon-containing silane precursor to achieve a particular dielectric constant without sacrificing other physical properties of the resulting carbon-containing silicon oxide dielectric material.

SUMMARY OF THE INVENTION

In accordance with the invention, a low dielectric constant multiple carbon-containing silicon oxide dielectric material for an integrated circuit structure comprises a silicon oxide material including silicon atoms which are each bonded to a multiple carbon-containing group consisting of carbon atoms and primary hydrogens. Preferably such multiple carbon-containing groups have the general formula —$(C)_y(CH_3)_z$, where y is an integer from 1 to 4 for a branched alkyl group and from 3 to 5 for a cyclic alkyl group and z is 2y+1 for a branched alkyl group and 2y−1 for a cyclic alkyl group.

In one embodiment the low dielectric constant multiple carbon-containing silicon oxide dielectric material is made by reacting with a mild oxidizing agent a multiple carbon-substituted silane having only primary hydrogens bonded to the carbon atoms and having the formula $SiH_x((C)_y(CH_3)_z)_{(4-x)}$, where x ranges from 1 to 3, y is an integer from 1 to 4 for a branched alkyl group and from 3 to 5 for a cyclic alkyl group and z is 2y+1 for a branched alkyl group and 2y−1 for a cyclic alkyl group.

BRIEF DESCRIPTION OF THE DRAWING

The sole FIGURE is a flow sheet illustrating the formation of the low dielectric constant multiple carbon-containing silicon oxide dielectric material of the invention.

DETAILED DESCRIPTION OF THE INVENTION a. Summary of Structure of Carbon Group

The invention comprises a low dielectric constant multiple carbon-containing silicon oxide dielectric material for an integrated circuit structure which comprises a silicon oxide material including silicon atoms which are each bonded to a multiple carbon-containing group consisting of carbon atoms and primary hydrogens. Preferably, such multiple carbon-containing groups have the general formula —$(C)_y(CH_3)_z$, where y is an integer from 1 to 4 for a branched alkyl group and from 3 to 5 for a cyclic alkyl group and z is 2y+1 for a branched alkyl group and 2y−1 for a cyclic alkyl group.

In one embodiment the low dielectric constant multiple carbon-containing silicon oxide dielectric material is made by reacting with a mild oxidizing agent a multiple carbon-substituted silane having only primary hydrogens bonded to the carbon atoms and having the formula $SiH_x((C)_y(CH_3)_z)_{(4-x)}$, where x ranges from 1 to 3, y is an integer from 1 to 4 for a branched alkyl group and from 3 to 5 for a cyclic alkyl group, and z is 2y+1 for a branched alkyl group and 2y−1 for a cyclic aliphatic. It should be noted, in this regard, that the above described reaction of a mild oxidizing agent with substituted silane having the above formula may comprise reaction of the oxidizing agent with substituted silanes all having the same type of multiple carbon-containing group, or with a mixture of different substituted silanes, all fitting within the above formula, including a mixture of mono, di, and tri substituted silanes.

Preferably, the carbon-substituted silane is a mono-substituted silane, and x in the above formula has a value of 3. It should be noted, in this regard, that the low dielectric constant multiple carbon-containing silicon oxide dielectric material of the invention may also include silicon atoms not bonded to such multiple carbon-containing groups, as will be discussed below.

b. Definitions of Terms in Summary

By use of the term "low dielectric constant" herein, with respect to the low dielectric constant multiple carbon-containing silicon oxide dielectric material of the invention, is meant a dielectric constant (k) which is less than the dielectric constant of a conventional silicon oxide dielectric material which does not contain carbon. Preferably, the dielectric constant of the low dielectric constant multiple carbon-containing silicon oxide dielectric material of the invention will be a value of 3 or less.

By use of the term "carbon-containing" herein, with respect to the low dielectric constant multiple carbon-containing silicon oxide dielectric material of the invention, is meant a silicon oxide-containing material having one or more multiple carbon-containing groups with one carbon atom in each carbon-containing group bonded to a silicon atom.

By use of the term "multiple carbon-containing group" herein, with respect to the low dielectric constant multiple carbon-containing silicon oxide dielectric material of the invention, is meant a carbon group comprising at least four carbon atoms bonded together in a structure wherein one of the carbon atoms in the group is bonded to a silicon atom and the remaining carbon atoms are each bonded to either a plurality of carbon atoms or to a single carbon atom and three primary hydrogen atoms.

By use of the term "primary hydrogen" herein is meant hydrogen atoms bonded in multiples of three to a single carbon atom which is bonded to only one other carbon atom, in contrast to secondary hydrogens which are bonded to a carbon atom which is bonded to two other carbon atoms, such as, for example, a —$CH_2$—$CH_2$—$CH_2$— structure.

By use of the term "aliphatic" herein is meant straight or branched chain arrangements of the carbon atoms in the multiple carbon group, as well as alicyclic arrangements of the multiple carbon group, i.e., in a (non-aromatic) closed ring structure.

By use of the term "mild oxidizing agent" herein is meant an oxidizing agent capable of breaking Si—H bonds to form Si—O bonds, without any substantial breaking of the C—H bond between the primary hydrogens and the carbon atoms in the multiple carbon-containing group to oxidize the carbon.

c. Names of Specific Carbon Groups in General Formula

The multiple carbon-containing branched alkyl group containing only primary hydrogens and having the formula —$(C)_y(CH_3)_z$ where y is an integer from 1–4 and z is 2y+1, and which is bonded to a silicon atom in the silicon oxide material, includes:

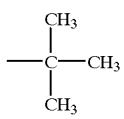

1,1,-dimethyl ethyl group;

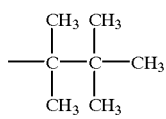

1,1,2,2-tetramethyl propyl group;

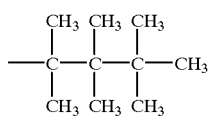

1,1,2,2,3,3-hexamethyl butyl group; and

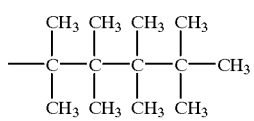

1,1,2,2,3,3,4,4-octamethyl pentyl group.

The multiple carbon-containing cyclic alkyl group containing only primary hydrogens and having the formula —$(C)_y(CH_3)_z$ where y is an integer from 3–5 and z is 2y−1, and which is bonded to a silicon atom in the silicon oxide material, includes;

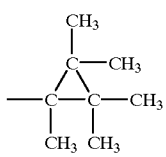

1,2,2,3,3-pentamethyl cylcopropyl group;

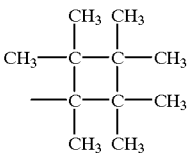

1,2,2,3,3,4,4-heptamethyl cyclobutyl group; and

-continued

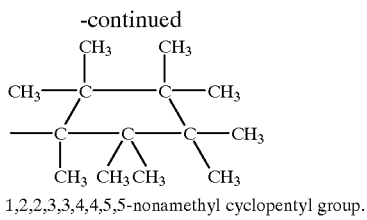

1,2,2,3,3,4,4,5,5-nonamethyl cyclopentyl group.

d. How to Make Silicon Oxide Dielectric Material with Multiple Carbon-Containing Groups As previously stated, in the preferred embodiment, the low dielectric constant (low k) multiple carbon-containing silicon oxide dielectric material of the invention is formed by reacting carbon substituted silane with a mild oxidizing agent which will not break the C—H bonds between the carbon atoms and the primary hydrogen atoms to thereby oxidize the carbon atoms. The mild oxidizing agent preferably is hydrogen peroxide ($H_2O_2$) and the substituted silane has one or more of the above-described multiple carbon-containing groups bonded to the silicon atom in substitution for one or more hydrogens of the silane molecule. Other oxidizing agents can be used in place of hydrogen peroxide provided that they will not oxidize sufficiently vigorously to cause the C—H bond to break in preference to the Si—H bond, and therefore will not interfere with the film forming capability of the reaction product of the oxidizing agent and the substituted silane containing the above-described multiple carbon-containing group or groups.

Prior to formation of the low k dielectric material on a silicon substrate surface, it is preferable to form a thin silicon oxide ($SiO_2$) or silicon nitride base layer over the substrate which will act as a moisture barrier layer for the low k dielectric material subsequently formed thereon. The base layer should be at least about 50 nanometers (nm) in thickness to provide adequate protection for the low k dielectric layer to be formed thereon. Thicknesses exceeding this minimum may be used, but are probably unnecessary and may negatively contribute to an undesired rise in the overall dielectric constant of the composite layer. A similar moisture barrier is preferably formed over the low k dielectric layer for the same reasons and to the same thickness. This barrier is formed to protect the low k dielectric material during subsequent processing steps.

The substituted silane and the oxidizing agent reactants may be reacted together by introducing them into a reaction chamber containing a silicon substrate on which the reaction product will deposit. The reaction chamber is advantageously maintained at a pressure of from about 0.1 Torr to about 50 Torr, preferably from about 1 Torr to about 10 Torr, and most preferably from about 1 Torr to about 5 Torr. Both the substituted silane and the hydrogen peroxide are introduced into the chamber in a gaseous phase. The delivery system for the reactants is maintained at a temperature of from about 70° C. to about 100° C. to ensure delivery of the reactants into the chamber as gases or vapors. Flow rates of the individual reactants will depend upon chamber size and will also vary with the particular reactants. During the reaction and deposition, the temperature of the silicon substrate in the reaction chamber is maintained below ambient (~25° C.), and preferably below about 10° C., to avoid fast cross-linking of the reaction product as it forms. The reaction is carried out for a period of time sufficient to form the layer of low k dielectric material to the desired thickness over the integrated circuit structure already formed on the silicon substrate. Usually this thickness will range from a minimum of about 300 nm to ensure sufficient electrical insulation between underlying conductive regions and conductive regions to be formed over the low k dielectric material up to a maximum of about 800 nm. Thicker layers can be formed, but are deemed unnecessary and merely add to the bulk of the structure.

In accordance with a method preferred at present for making the low dielectric constant multiple carbon-containing silicon oxide dielectric material of the invention, a reaction retardant may be added to the reactants to influence the reaction rate, thereby enhancing the quality of the product. Such reaction retardants are described more fully in copending U.S. patent application Ser. No. 09/274,254, entitled FORMATION OF IMPROVED LOW DIELECTRIC CONSTANT CARBON-CONTAINING SILICON OXIDE DIELECTRIC MATERIAL BY REACTION OF CARBON-CONTAINING SILANE WITH OXIDIZING AGENT IN THE PRESENCE OF ONE OR MORE REACTION RETARDANTS, filed by one of us on Mar. 22, 1999, and assigned to the assignee of this invention.

e. Low k Silicon Oxide Dielectric Material Made From Mixtures of Silanes and/or Various Carbon-Containing Silanes While the invention principally comprises a low dielectric constant (low k) silicon oxide dielectric material formed containing multiple carbon-containing groups having only primary hydrogen atoms bonded to the carbons in the carbon-containing groups, it is within the scope of the invention to form mixtures of the low k multiple carbon-containing silicon oxide dielectric material of the invention and other silicon oxide materials, including either silicon oxide dielectric material containing no carbon atoms, or silicon oxide dielectric materials containing minor amounts of other carbon-containing groups which do not meet the above criteria, either because they do not contain multiple carbons or because they have non-primary hydrogens, e.g., secondary hydrogens, bonded to the carbon atoms. Such materials may be blended with the low k multiple carbon-containing silicon oxide dielectric material of the invention to enhance other physical properties of the resultant film of low k dielectric material.

For example, to enhance the film forming properties of the low dielectric constant multiple carbon-containing silicon oxide dielectric material of the invention, it may be blended with:

a) silicon oxide dielectric material having no silicon atoms bonded to carbon-containing groups;

b) silicon oxide dielectric material containing silicon atoms which are each bonded to one or more single carbon groups (such as the low k silicon oxide dielectric material formed by the Trikon Flowfill process of reacting methyl silane with hydrogen peroxide);

c) silicon oxide dielectric material containing silicon atoms which are each bonded to a carbon group which contains secondary hydrogens (such as the low k silicon oxide dielectric material formed by reacting methylenebis-silane with hydrogen peroxide);

d) silicon oxide dielectric material containing silicon atoms which are each bonded to a single aromatic carbon group; and e) mixtures of any two or more of a), b), c), and d).

Such a mixture of dielectric materials which includes the low dielectric constant multiple carbon-containing silicon oxide dielectric material of the invention may be formed, for example, by reacting hydrogen peroxide ($H_2O_2$) with a mixture of the appropriate silanes (silane or substituted silanes). For example, a mixture of silicon oxide dielectric materials corresponding to mixture a) above could be made by reacting hydrogen peroxide with a mixture of silane ($SiH_4$) and a substituted silane having the formula $SiH_x((C)_y(CH_3)_z)_{(4-x)}$, where x ranges from 1 to 3, y is an integer from 1 to 4 for a branched alkyl group and 3–5 for a cyclic alkyl group and z is 2y+1 for a branched alkyl group and 2y–1 for a cyclic alkyl group.

To form a mixture of silicon oxide dielectric materials corresponding to mixture b), one would substitute methyl silane for the silane used in the above description for forming mixture a).

To form a mixture including both a) and b), one would use both silane and methyl silane in combination with the above-described substituted silane having the formula $SiH_x((C)_y(CH_3)_z)_{(4-x)}$. Other examples of substituted silanes which can be use either singly or in combination to form mixtures of dielectric materials with the low k multiple carbon-containing silicon oxide dielectric material of the invention include dimethyl silane, ethyl silane, isopropyl (1-methylethyl) silane, n-butyl silane, isobutyl (2-methyl propyl) silane, phenyl silane, and methylenebis-silane.

As stated above, the amount of such dielectric materials which may be added to the low dielectric constant multiple carbon-containing silicon oxide dielectric material of the invention should be a minor amount. By use of the term "minor amount" is meant that over 50 volume % of the total volume of the dielectric material in the mixture should comprise the low dielectric constant multiple carbon-containing silicon oxide dielectric material of the invention. However, it is recognized that in some instances the enhancement of other properties of the resulting mixture, e.g., the film forming properties, may justify the use of more that 50 volume % of other dielectric materials, that is, up to about 70 volume % of other dielectric materials and 30 volume % of the low dielectric constant carbon-containing silicon oxide dielectric material of the invention, even though such usage may raise the dielectric constant of the resulting mixture.

When using such mixtures the average dielectric constant of the mixture may be determined for the particular proportions of such dielectric materials using the formula:

$$k_{av} = \Sigma_i x_i k_i$$

where $x_i$ is the volume fraction of dielectric component i and $k_i$ is the dielectric constant of the pure dielectric component. Thus, for example, dielectric materials a and b might be added to the low dielectric constant multiple carbon-containing silicon oxide dielectric material of the invention to enhance the film forming properties of the resulting mixture. If a mixture is formed comprising 10 volume % of dielectric material a, 15 volume % of dielectric material b, and 75 volume % of the low dielectric constant multiple carbon-containing silicon oxide dielectric material of the invention, the average dielectric constant of the mixture will comprise the summation of the products of the dielectric constant of each of the materials times its volume % in the mixture. If the dielectric constant of the low dielectric constant multiple carbon-containing silicon oxide dielectric material of the invention is 2.8, the dielectric constant of dielectric material a is 3.5, and the dielectric constant of dielectric material b is 3.4, the average dielectric constant $k_{av}$ would equal (2.8×0.75)+(3.5×0.10)+(3.4×0.15)=2.96.

f. Example

To further illustrate preparation of the low dielectric constant multiple carbon-containing silicon oxide dielectric material of the invention, a 1,1-dimethyl ethyl monosubstituted silane having the formula $SiH_3$—$C_4H_9$ may be reacted with hydrogen peroxide to form a low dielectric constant multiple carbon-containing silicon oxide dielectric material of the invention having the general (non-stoichiometric) formula: $(C_4H_9)$—$SiO_x$ where x has a value of from about 1.5 to some value less than 2. The 1,1-dimethyl ethyl monosubstituted silane reactant having the formula $SiH_3$—$C_4H_9$ may be formed using the procedure described by Tannenbaum et al., in "Synthesis and Properties of Some Alkylsilanes" published in the Journal of the American Chemical Society, 75 (1953) at pp 3753–3757.

The 1,1-dimethyl ethyl monosubstituted silane reactant may be vaporized and flowed into a reaction chamber together with a flow of gaseous hydrogen peroxide while maintaining a pressure of about 1–5 Torr in the reaction chamber. A silicon substrate mounted in the reaction chamber is maintained at a temperature of from about 0–5° C. to retard the crosslinking of the resulting film of reaction product as it deposits on the substrate. After a period of about 1 minute, the flows of the reactants may be stopped, and the coated substrate removed from the reaction chamber. Measurement of the k of the resulting silicon oxide dielectric material will show a value below about 3. Similar results may be obtained using other carbon-substituted silanes which have been substituted with alkyl groups such as a 1,1,2,2-tetramethyl propyl group; a 1,1,2,2,3,3-hexamethyl butyl group; a 1,1,2,2,3,3,4,4-octamethyl pentyl group; a 1,2,2,3,3-pentamethyl cyclopropyl group; a 1,2,2,3,3,4,4-heptamethyl cyclobutyl group; or a 1,2,2,3,3,4,4,5,5-nonamethyl cyclopentyl group; as well as di or tri-substituted silanes having the same groups, and mixtures of any of the above.

Thus, the invention provides a novel low dielectric constant multiple carbon-containing silicon oxide dielectric material which comprises a silicon oxide material including silicon atoms each bonded to one or more multiple carbon-containing groups consisting of at least four carbon atoms and primary hydrogens.

Having thus described the invention what is claimed is:

1. A low dielectric constant multiple carbon-containing silicon oxide dielectric material for use in an integrated circuit structure which comprises a silicon oxide material including silicon atoms each bonded to one or more multiple carbon-containing groups consisting of carbon atoms and primary hydrogens, each of said multiple carbon-containing groups having the formula —$(C)_y(CH_3)_z$, where y is an integer from 1 to 4 for a branched alkyl group and 3 to 5 for a cyclic alkyl group, and z is 2y+1 for a branched alkyl group and 2y–1 for a cyclic alkyl group.

2. The low dielectric constant multiple carbon-containing silicon oxide dielectric material of claim 1 which further comprises additional materials selected from the group consisting of:

a) silicon oxide dielectric material having no silicon atoms bonded to carbon-containing groups;

b) silicon oxide dielectric material containing silicon atoms which are each bonded to one or more single carbon groups;

c) silicon oxide dielectric material containing silicon atoms which are each bonded to a carbon group containing secondary hydrogens;

d) silicon oxide dielectric material containing silicon atoms which are each bonded to a single aromatic carbon group; and e) mixtures of any two or more of a), b), c), and d).

3. A low dielectric constant multiple carbon-containing silicon oxide dielectric material for an integrated circuit structure which comprises a silicon oxide material including silicon atoms each bonded to a multiple carbon-containing branched alkyl group consisting of carbon atoms and primary hydrogens, and having the formula —$(C)_y(CH_3)_z$, where y is an integer from 1 to 4, and z is 2y+1.

4. The low dielectric constant multiple carbon-containing silicon oxide dielectric material of claim 3 wherein said multiple carbon-containing branched alkyl group comprises a 1,1-dimethyl ethyl group having the formula —$C_4H_9$.

5. The low dielectric constant multiple carbon-containing silicon oxide dielectric material of claim 3 wherein said multiple carbon-containing branched alkyl group comprises a 1,1,2,2-tetramethyl propyl group having the formula —$C_7H_{15}$.

6. The low dielectric constant multiple carbon-containing silicon oxide dielectric material of claim 3 wherein said multiple carbon-containing branched alkyl group comprises a 1,1,2,2,3,3-hexamethyl butyl group having the formula —$C_{10}H_{21}$.

7. The low dielectric constant multiple carbon-containing silicon oxide dielectric material of claim 3 wherein said multiple carbon-containing branched alkyl group comprises a 1,1,2,2,3,3,4,4-octamethyl pentyl group having the formula —$C_{13}H_{27}$.

8. The low dielectric constant multiple carbon-containing silicon oxide dielectric material of claim 3 which further includes additional materials selected from the group consisting of silicon oxide, dimethyl silane, ethyl silane, isopropyl silane, n-butyl silane, isobutyl silane, phenyl silane, and methylenebis-silane, and mixtures of two or more of same.

9. The low dielectric constant multiple carbon-containing silicon oxide dielectric material of claim 3 which further comprises a mixture of said low dielectric constant multiple carbon-containing silicon oxide dielectric material and additional materials selected from the group consisting of:
   a) silicon oxide dielectric material having no silicon atoms bonded to carbon-containing groups;
   b) silicon oxide dielectric material containing silicon atoms which are each bonded to one or more single carbon groups;
   c) silicon oxide dielectric material containing silicon atoms which are each bonded to a carbon group which contains secondary hydrogens;
   d) silicon oxide dielectric material containing silicon atoms which are each bonded to a single aromatic carbon group; and
   e) mixtures of any two or more of a), b), c), and d).

10. The mixture of claim 9 wherein said additional materials comprise not more than 70 volume % of the total volume of said mixture.

11. The mixture of claim 9 wherein said additional materials comprise less than 50 volume % of the total volume of said mixtures.

12. A low dielectric constant multiple carbon-containing silicon oxide dielectric material for an integrated circuit structure which comprises a silicon oxide material including silicon atoms each bonded to a multiple carbon-containing cyclic alkyl group consisting of carbon atoms and primary hydrogens, and having the formula —$(C)_y(CH_3)_z$, where y is an integer from 3 to 5, and z is 2y−1.

13. The low dielectric constant multiple carbon-containing silicon oxide dielectric material of claim 12 wherein said multiple carbon-containing cyclic alkyl group comprises a 1,2,2,3,3-pentamethyl cyclopropyl group having the formula —$C_8H_{15}$.

14. The low dielectric constant multiple carbon-containing silicon oxide dielectric material of claim 12 wherein said multiple carbon-containing cyclic alkyl group comprises a 1,2,2,3,3,4,4-heptamethyl cyclobutyl group having the formula —$C_{11}H_{21}$.

15. The low dielectric constant multiple carbon-containing silicon oxide dielectric material of claim 12 wherein said multiple carbon-containing cyclic alkyl group comprises a 1,2,2,3,3,4,4-nonamethyl cyclopentyl group having the formula —$C_{14}H_{27}$.

16. The low dielectric constant multiple carbon-containing silicon oxide dielectric material of claim 12 which further includes additional materials selected from the group consisting of silicon oxide, dimethyl silane, ethyl silane, isopropyl silane, n-butyl silane, isobutyl silane, phenyl silane, and methylenebis-silane, and mixtures of two or more of same.

17. The low dielectric constant multiple carbon-containing silicon oxide dielectric material of claim 12 which further comprises a mixture of said low dielectric constant multiple carbon-containing silicon oxide dielectric material and additional materials selected from the group consisting of:
   a) silicon oxide dielectric material having no silicon atoms bonded to carbon-containing groups;
   b) silicon oxide dielectric material containing silicon atoms which are each bonded to one or more single carbon groups;
   c) silicon oxide dielectric material containing silicon atoms which are each bonded to a carbon group which contains secondary hydrogens;
   d) silicon oxide dielectric material containing silicon atoms which are each bonded to a single aromatic carbon group; and
   e) mixtures of any two or more of a), b), c), and d).

18. The mixture of claim 17 wherein said additional materials comprise not more than 70 volume % of the total volume of said mixture.

19. The mixture of claim 17 wherein said additional materials comprise less than 50 volume % of the total volume of said mixtures.

20. A low dielectric constant carbon-containing silicon oxide dielectric material for an integrated circuit structure comprising a silicon oxide material containing silicon atoms which are each bonded to one or more multiple carbon-containing groups, each consisting of carbons and primary hydrogens and formed by reacting with a mild oxidizing agent a carbon-substituted silane having only primary hydrogens bonded to the carbon atoms and having the formula: $SiH_x((C)_y(CH_3)_z)_{(4-x)}$, where x ranges from 1 to 3, y is an integer from 1 to 4 for a branched alkyl group and from 3 to 5 for a cyclic alkyl group, and z is 2y+1 for a branched alkyl group and 2y−1 for a cyclic alkyl group.

21. The low dielectric constant carbon-containing silicon oxide dielectric material of claim 20 wherein x is 3.

22. The low dielectric constant multiple carbon-containing silicon oxide dielectric material of claim 20 wherein said mild oxidizing agent comprises hydrogen peroxide ($H_2O_2$).

23. A low dielectric constant carbon-containing silicon oxide dielectric material for an integrated circuit structure comprising a silicon oxide material containing silicon atoms which are each bonded to a multiple carbon-containing branched alkyl group consisting of carbons and primary hydrogens and formed by reacting with a mild oxidizing agent a carbon-substituted silane having only primary hydrogens bonded to the carbon atoms and having the formula: $SiH_x((C)_y(CH_3)_z)_{(4-x)}$, where x ranges from 1 to 3, y is an integer from 1 to 4, and z is 2y+1.

24. The low dielectric constant carbon-containing silicon oxide dielectric material of claim 23 wherein x is 3.

25. The low dielectric constant multiple carbon-containing silicon oxide dielectric material of claim 23 wherein said mild oxidizing agent comprises hydrogen peroxide ($H_2O_2$).

26. A low dielectric constant carbon-containing silicon oxide dielectric material for an integrated circuit structure comprising a silicon oxide material containing silicon atoms which are each bonded to a multiple carbon-containing cyclic alkyl group consisting of carbons and primary hydrogens and formed by reacting with a mild oxidizing agent a carbon-substituted silane having only primary hydrogens bonded to the carbon atoms and having the formula: $SiH_x((C)_y(CH_3)_z)_{(4-x)}$, where x ranges from 1 to 3, y is an integer from 3 to 5, and z is 2y−1.

27. The low dielectric constant carbon-containing silicon oxide dielectric material of claim 26 wherein x is 3.

28. The low dielectric constant multiple carbon-containing silicon oxide dielectric material of claim 26 wherein said mild oxidizing agent comprises hydrogen peroxide ($H_2O_2$).

29. A process for forming a low dielectric constant carbon-containing silicon oxide dielectric material for an integrated circuit structure comprising a silicon oxide material containing silicon atoms which are each bonded to a multiple carbon-containing group consisting of carbons and primary hydrogens, said process comprising: reacting with a mild oxidizing agent a carbon-substituted silane having only primary hydrogens bonded to the carbon atoms and having the formula: $SiH_x((C)_y(CH_3)_z)_{(4-x)}$, where x ranges from 1 to 3, y is an integer from 1 to 4 for a branched alkyl group and from 3 to 5 for a cyclic alkyl group, and z is 2y+1 for a branched alkyl group and 2y−1 for a cyclic alkyl group.

30. The process of claim 29 wherein x is 3, and said mild oxidizing agent comprises hydrogen peroxide.

31. A process for forming a low dielectric constant carbon-containing silicon oxide dielectric material for an integrated circuit structure comprising a silicon oxide material containing silicon atoms which are each bonded to a multiple carbon-containing group consisting of carbons atoms and primary hydrogens, said process comprising: reacting with a mild oxidizing agent a carbon-substituted silane comprising a multiple carbon group having the formula —$(C)_y(CH_3)_z$, where y is an integer from 1 to 4 for a branched alkyl group and 3 to 5 for a cyclic alkyl group, and z is 2y+1 for a branched alkyl group and 2y−1 for a cyclic alkyl group.

32. The process of claim 31 which further comprises the step of adding to the product of said process additional materials selected from the group consisting of:

a) silicon oxide dielectric material having no silicon atoms bonded to carbon-containing groups;

b) silicon oxide dielectric material containing silicon atoms which are each bonded to one or more single carbon groups;

c) silicon oxide dielectric material containing silicon atoms which are each bonded to a carbon group containing secondary hydrogens;

d) silicon oxide dielectric material containing silicon atoms which are each bonded to a single aromatic carbon group; and e) mixtures of any two or more of a), b), c), and d).

* * * * *